(12) United States Patent
Shibayama et al.

(10) Patent No.: US 8,980,675 B2
(45) Date of Patent: Mar. 17, 2015

(54) PRODUCTION METHOD FOR SPECTROSCOPIC SENSOR

(75) Inventors: Katsumi Shibayama, Hamamatsu (JP); Takashi Kasahara, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/349,097

(22) PCT Filed: Sep. 10, 2012

(86) PCT No.: PCT/JP2012/073081
§ 371 (c)(1),
(2), (4) Date: Apr. 18, 2014

(87) PCT Pub. No.: WO2013/051373
PCT Pub. Date: Apr. 11, 2013

(65) Prior Publication Data
US 2014/0256079 A1    Sep. 11, 2014

(30) Foreign Application Priority Data

Oct. 4, 2011    (JP) .................... P2011-220177

(51) Int. Cl.
| | |
|---|---|
| H01L 21/00 | (2006.01) |
| H01L 31/18 | (2006.01) |
| G01J 3/26 | (2006.01) |
| G02B 5/28 | (2006.01) |
| G01J 3/02 | (2006.01) |
| G01J 3/36 | (2006.01) |
| H01L 31/0232 | (2014.01) |
| G01J 3/12 | (2006.01) |

(52) U.S. Cl.
CPC .............. H01L 31/1896 (2013.01); G01J 3/26 (2013.01); G02B 5/284 (2013.01); G01J 3/02 (2013.01); G01J 3/36 (2013.01); G02B 5/28 (2013.01); H01L 31/0232 (2013.01); G01J 2003/1234 (2013.01)
USPC ............................................... 438/65; 438/66

(58) Field of Classification Search
CPC .................... H01L 31/1986; H01L 31/1892
USPC ................................................ 438/52, 65, 66
See application file for complete search history.

(56) References Cited

U.S. PATENT DOCUMENTS

2001/0028503 A1* 10/2001 Flanders et al. ............. 359/578
2006/0077531 A1* 4/2006 Novotny et al. ............. 359/291

FOREIGN PATENT DOCUMENTS

| JP | 2000-081512 A | 3/2000 |
|---|---|---|
| JP | 2001-210810 A | 8/2001 |
| WO | WO-2008/017490 A2 | 2/2008 |

OTHER PUBLICATIONS

English-language translation of International Preliminary Report on Patentability (IPRP) dated Apr. 17, 2014 that issued in WO Patent Application No. PCT/JP2012/073081.

*Primary Examiner* — Caridad Everhart
(74) *Attorney, Agent, or Firm* — Drinker Biddle & Reath LLP

(57) ABSTRACT

A method for manufacturing a spectroscopic sensor 1 comprises a first step of forming a cavity layer 21 by etching a surface layer disposed on a handle substrate, a second step of forming a first mirror layer 22 on the cavity layer 21 after the first step, a third step of joining a light-transmitting substrate 3 onto the first mirror layer 22 after the second step, a fourth step of removing the handle substrate from the cavity layer 21 after the third step, a fifth step of forming a second mirror layer 23 on the cavity layer 21 devoid of the handle substrate after the fourth step, and a sixth step of joining a light-detecting substrate 4 onto the second mirror layer after the fifth step.

4 Claims, 22 Drawing Sheets

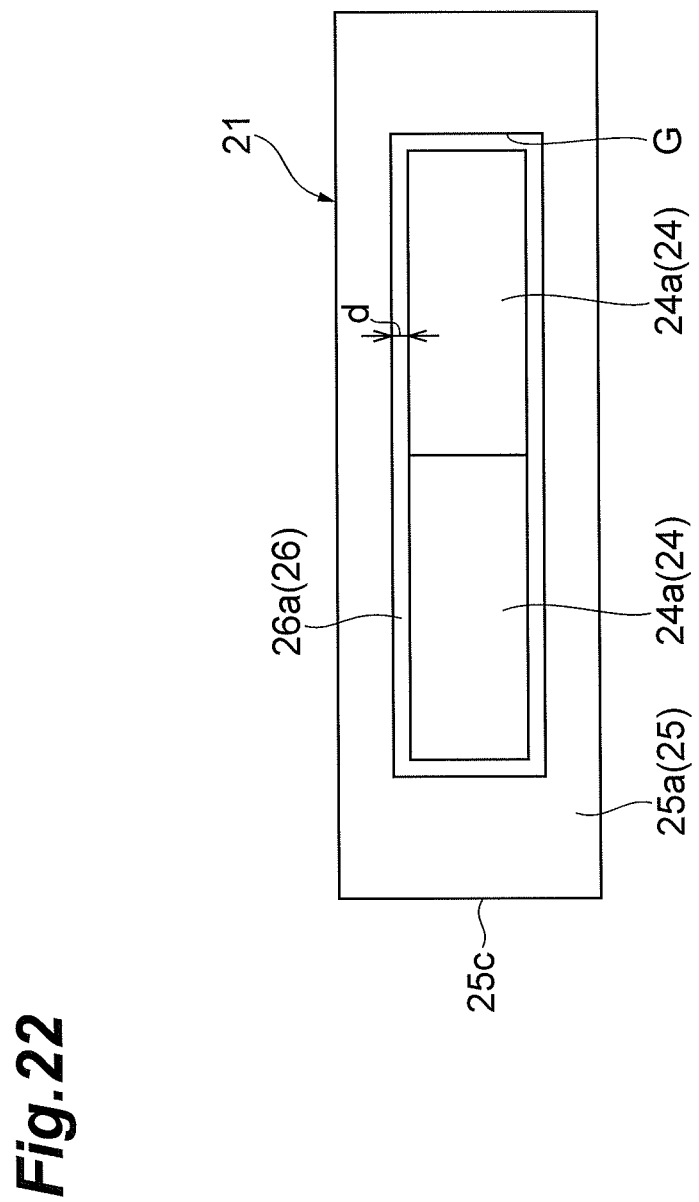

PRODUCTION METHOD FOR SPECTROSCOPIC SENSOR

TECHNICAL FIELD

The present invention relates to a method for manufacturing a spectroscopic sensor.

BACKGROUND ART

Known as a conventional spectroscopic sensor is one comprising an interference filter unit for transmitting therethrough light having a predetermined wavelength according to an incident position of light, a light-transmitting substrate for transmitting therethrough the light incident on the interference filter unit, and a light-detecting substrate for detecting the light transmitted through the interference filter unit. Here, a pair of mirror layers may oppose each other through a cavity layer so as to construct the interference filter unit as that of Fabry-Perot type.

As a method for manufacturing such a spectroscopic sensor, the following method is disclosed in Patent Literature 1. First, one mirror layer is formed on a light-detecting substrate, and then a cavity layer is formed by a nanoimprint process on the mirror layer. Subsequently, the other mirror layer is formed on the cavity layer, and finally a light-transmitting substrate is joined onto the latter mirror layer.

CITATION LIST

Patent Literature

Patent Literature 1: International Publication No. 2008/017490

SUMMARY OF INVENTION

Technical Problem

However, the method for manufacturing a spectroscopic sensor disclosed in Patent Literature 1 yields a fear of the manufactured spectroscopic sensor lowering its reliability. The following are reasons therefor. That is, since irregularities caused by forming of a light-receiving unit, a wiring layer, and the like exists on the surface of the light-detecting substrate, there is a high risk of failing to attain a cavity layer with a high precision (e.g., on the order of nm) when forming the cavity layer by nanoimprint process on the mirror layer formed on such a surface. Also, since the mirror layers and the cavity layer are formed such as to be stacked on the light-detecting substrate, each process is likely to give damage to the light-detecting substrate.

It is therefore an object of the present invention to provide a method for manufacturing a spectroscopic sensor which can yield a highly reliable spectroscopic sensor.

Solution to Problem

The method for manufacturing a spectroscopic sensor in accordance with one aspect of the present invention is a method for manufacturing a spectroscopic sensor comprising an interference filter unit, having a cavity layer and first and second mirror layers opposing each other through the cavity layer, for selectively transmitting therethrough light in a predetermined wavelength range according to an incident position thereof; a light-transmitting substrate for transmitting therethrough light incident on the interference filter unit; and a light-detecting substrate for detecting the light transmitted through the interference filter unit; the method comprising a first step of forming the cavity layer by etching a surface layer disposed on a handle substrate; a second step of forming the first mirror layer on the cavity layer after the first step; a third step of joining the light-transmitting substrate onto the first mirror layer after the second step; a fourth step of removing the handle substrate from the cavity layer after the third step; a fifth step of forming the second mirror layer on the cavity layer devoid of the handle substrate after the fourth step; and a sixth step of joining the light-detecting substrate onto the second mirror layer after the fifth step.

This spectroscopic sensor manufacturing method forms a cavity layer by etching a surface layer disposed on a handle substrate. Thus forming the cavity layer by using the handle substrate can stably yield the cavity layer with a high precision. After forming the cavity layer and the first and second mirror layers on the light-transmitting substrate side, the light-detecting substrate is joined. This can prevent the light-detecting substrate from being damaged in the processes for forming the cavity layer and mirror layers. Hence, this spectroscopic sensor manufacturing method can yield a highly reliable spectroscopic sensor.

Here, before the first step, a silicon oxide film may be formed on one of main faces of the handle substrate made of silicon, and the silicon oxide film may be employed as the surface layer. This can stably yield a high-quality cavity layer at low cost.

Before the first step, both main faces of a silicon substrate may be thermally oxidized so as to form silicon oxide films on both main faces of the handle substrate made of silicon, and the silicon oxide film formed on one of the main faces of the handle substrate may be employed as the surface layer. This restrains the handle substrate from warping, whereby the cavity layer can stably be obtained with higher precision.

An optical filter layer for transmitting therethrough light in the predetermined wavelength range may be formed on the light-transmitting substrate before the third step, and, in the third step, the light-transmitting substrate may be joined onto the first mirror layer such that the first mirror layer and the optical filter layer oppose each other. This can make the light in the predetermined wavelength range efficiently incident on the interference filter unit.

Advantageous Effects of Invention

The present invention can yield a highly reliable spectroscopic sensor.

BRIEF DESCRIPTION OF DRAWINGS

FIG. 22 is a plan view of the cavity layer in the spectroscopic sensor of FIG. 20.

DESCRIPTION OF EMBODIMENTS

Figure 1:
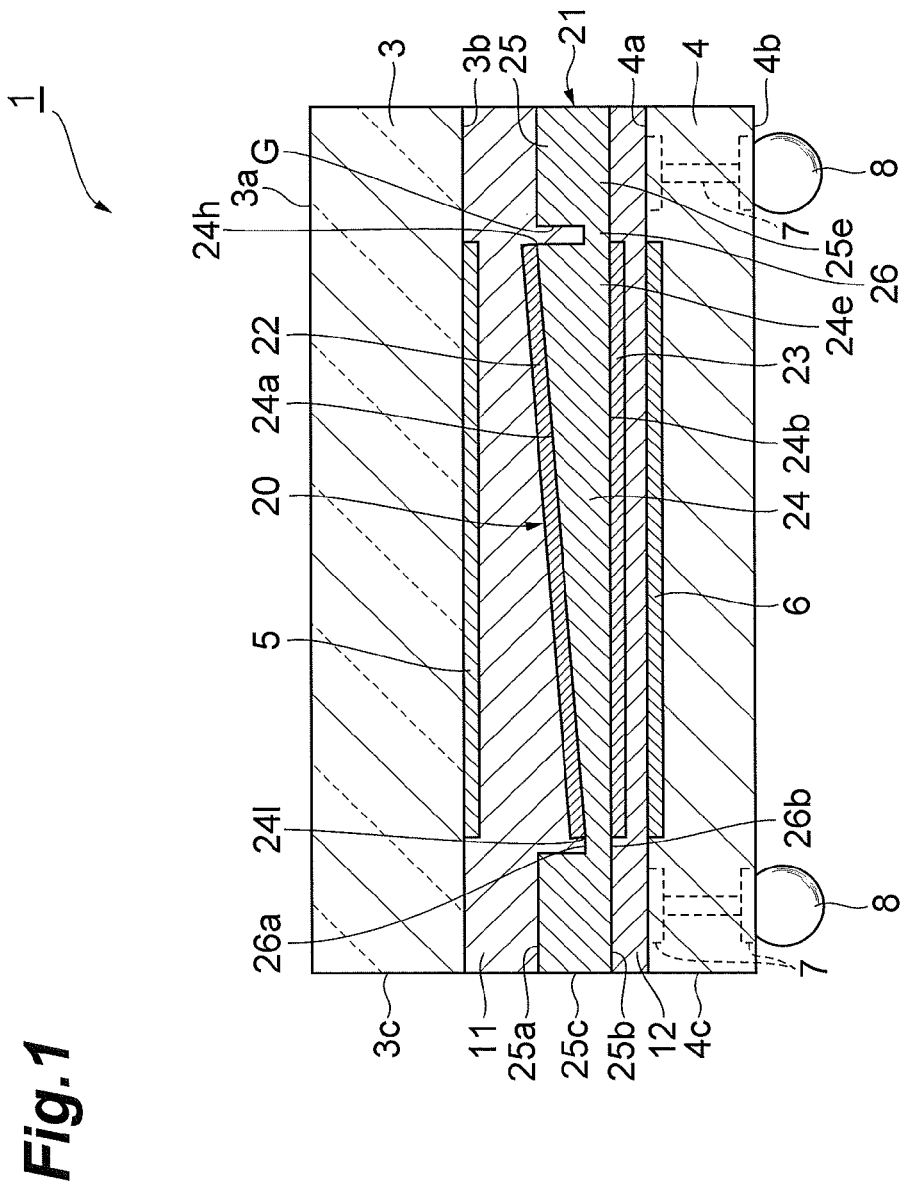
FIG. 1 is a vertical sectional view of a spectroscopic sensor manufactured by the spectroscopic sensor manufacturing method in accordance with an embodiment of the present invention.

In the following, preferred embodiments of the present invention will be explained in detail with reference to the drawings. In the drawings, the same or equivalent parts will be referred to with the same signs while omitting their overlapping descriptions.

As FIG. 1 illustrates, a spectroscopic sensor 1 comprises an interference filter unit 20 for selectively transmitting therethrough light in a predetermined wavelength range according to an incident position thereof, a light-transmitting substrate 3 for transmitting therethrough the light incident on the interference filter unit 20, and a light-detecting substrate 4 for detecting the light transmitted through the interference filter unit 4. The spectroscopic sensor 1 is constructed as a rectangular parallelepiped CSP (Chip Size Package) in which each side has a length of several hundred μm to several ten mm.

The light-transmitting substrate 3 is made of glass or the like and formed into a rectangular plate having a thickness on the order of 0.2 to 2 mm. An optical filter layer 5 is formed on the rear face 3b of the light-transmitting substrate 3 so as to oppose the interference filter unit 20. The optical filter layer 5, which is a dielectric multilayer film or organic color filter (color resist), is formed into a rectangular film having a thickness on the order of 0.1 to 10 μm. The optical filter layer 5 functions as a bandpass filter for transmitting therethrough light in the predetermined wavelength range to be incident on its opposed interference filter unit 20.

The light-detecting substrate 4, which is a photodiode array, is formed into a rectangular plate having a thickness on the order of 10 to 150 μm. The front face 4a of the light-detecting substrate 4 is formed with a light-receiving unit 6 for receiving the light transmitted through the interference filter unit 20. The light-receiving unit 6 is constructed by one-dimensionally arranging elongated photodiodes along the longitudinal direction of the light-detecting substrate 4, while each photodiode extends along a direction substantially perpendicular to the longitudinal direction of the light-detecting substrate 4. The light-detecting substrate 4 is further formed with leads 7 (front wiring, back wiring, through wiring, etc.) for taking out electric signals photoelectrically converted by the light-receiving unit 6. The rear face 4b of the light-detecting substrate 4 is provided with surface-mounting bumps 8 electrically connected to the leads 7. The light-detecting substrate 4 is not limited to a photodiode array, but may also be any of other semiconductor light-detecting elements (C-MOS image sensors, CCD image sensors, and the like).

The interference filter unit 20 has a cavity layer 21 and DBR (Distributed Bragg Reflector) layers 22, 23. In the interference filter unit 20, the DBR layers (first and second mirror layers) 22, 23 oppose each other through the cavity layer 21. That is, the cavity layer 21 keeps a distance between the DBR layers 22, 23 opposing each other. Each of the DBR layers 22, 23 is a dielectric multilayer film made of $SiO_2$, $TiO_2$, $Ta_2O_5$, $Nb_2O_5$, $Al_2O_3$, $MgF_2$, or the like and formed into a rectangular film having a thickness on the order of 0.1 to 10 μm.

Figure 2:
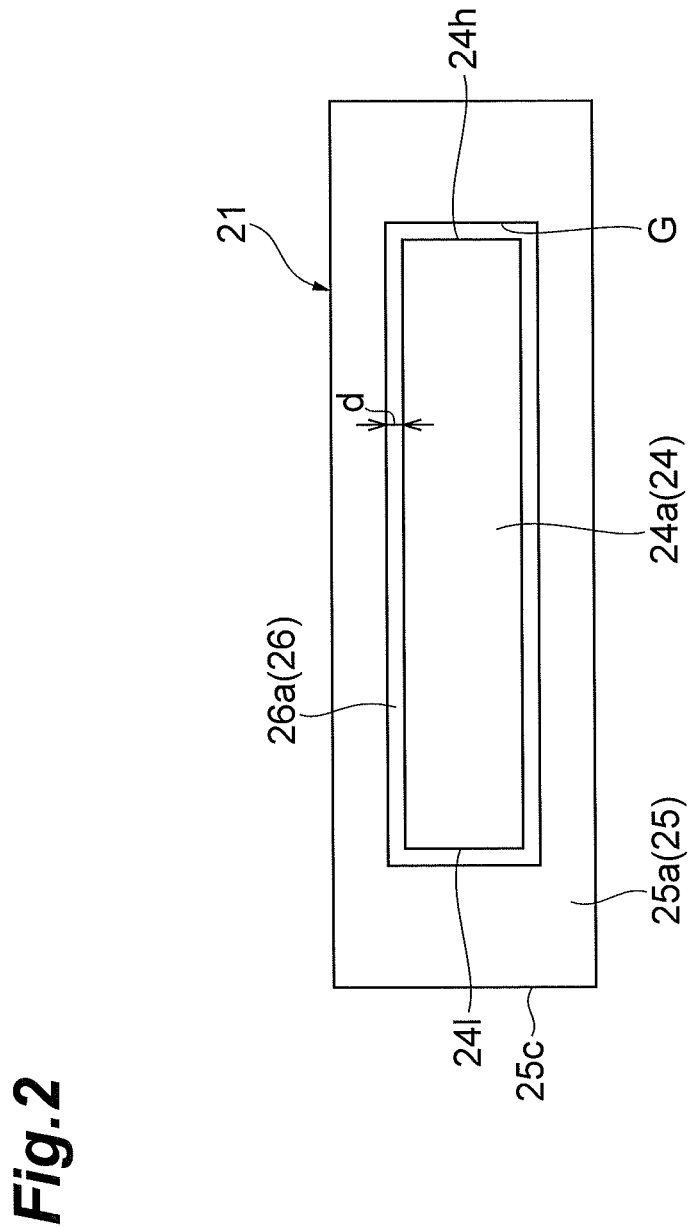
FIG. 2 is a plan view of a cavity layer in the spectroscopic sensor of FIG. 1.

The cavity layer 21 is a silicon oxide film ($SiO_2$ film), formed by thermally oxidizing silicon, having a thickness on the order of 100 nm to several μm. As FIGS. 1 and 2 illustrate, the cavity layer 21 has a filter region 24, a surrounding region 25, and a connecting region 26 which are formed integrally.

The filter region 24 is formed into a rectangular film, in which each side has a length on the order of several mm, and held between the DBR layers 22, 23. More specifically, the DBR layer 22 is formed on the front face 24a of the filter region 24, while the DBR layer 23 is formed on the rear face 24b of the filter region 24. The rear face 24b of the filter region 24 is substantially parallel to a plane perpendicular to the incident direction of light (the direction in which the light-transmitting substrate 3 and the light-detecting substrate 4 oppose each other), while the front face 24a of the filter region 24 is tilted with respect to this plane. As a consequence, the filter region 24 gradually increases its thickness on the order of 100 nm to several μm toward one longitudinal end of the spectroscopic sensor 1.

The surrounding region 25 is formed into a rectangular annular shape, in which each outer side has a length on the order of several mm, and surrounds the filter region 24 with a predetermined distance d (e.g., on the order of several μm to 1 mm) therefrom. The connecting region 26 is formed into a rectangular annular shape so as to be placed between the filter region 24 and surrounding region 25 and connects an end part 24e of the filter region 24 on the light-detecting substrate 4 side and an end part 25e of the surrounding region 25 on the light-detecting substrate 4 side to each other. The filter region 24, surrounding region 25, and connecting region 26 form a groove G which extends such as to surround the filter region 24 with a width d in the cavity layer 21.

As FIG. 1 illustrates, the front face (end face on the light-transmitting substrate side) 25a of the surrounding region 25 has substantially the same height as with a part 24h located closest to the light-transmitting substrate 3 in the front face (first mirror layer forming surface) 24a of the filter region 24 or is positioned nearer to the light-transmitting substrate 3 than is this part 24h. The front face (end face on the light-transmitting substrate side) 26a of the connecting region 26 has substantially the same height as with a part 24l located closest to the light-detecting substrate 4 in the front face 24a of the filter region 24 or is positioned nearer to the light-detecting substrate 4 than is this part 24l. On the other hand, the rear face 24b of the filter region 24, the rear face 25b of the surrounding region 25, and the rear face 26b of the connecting region 26 are substantially flush with each other. Here, a side face 25c of the surrounding region 25 is flush with a side face 3c of the light-transmitting substrate 3 and a side face 4c of the light-detecting substrate 4. However, a gap on the order of 0 to 100 μm may occur between the side face 3c of the light-transmitting substrate 3 and the side face 4c of the light-detecting substrate 4.

The light-transmitting substrate 3 is arranged on the DBR layer 22 side of the cavity layer 21 and joined to the cavity layer 21 and DBR layer 22 through a coupling layer (first coupling layer) 11. The light-detecting substrate 4 is arranged on the DBR layer 23 side of the cavity layer 21 and joined to the cavity layer 21 and DBR layer 23 through a coupling layer (second coupling layer) 12. Each of the coupling layers 11, 12 arranged between the interference filter unit 20 and the light-transmitting substrate 3 and light-detecting substrate 4 is a silicon oxide film formed by a film forming process using TEOS (Tetraethyl Orthosilicate, Tetraethoxysilane) as a material gas and has a thickness on the order of several hundred nm to 10 μm.

In thus constructed spectroscopic sensor 1, when light incident on the light-transmitting substrate 3 from the front face 3a thereof passes therethrough to reach the rear face 3b thereof, only light in a predetermined wavelength range to be incident on the interference filter unit 20 is transmitted through the optical filter layer 5. Then, when the light transmitted through the optical filter layer 5 is incident on the interference filter unit 20, light in a predetermined wavelength range is selectively transmitted therethrough according to its incident position. That is, a wavelength of light to enter each channel of the light-receiving unit 6 of the light-detecting substrate 4 is uniquely determined by the thicknesses and kinds of the DBR layers 22, 23 and thickness of the cavity layer 21 at the incident position. As a consequence, light having a different wavelength is detected for each channel of the light-receiving unit 6 in the light-detecting substrate 4.

In the spectroscopic sensor 1, as explained in the foregoing, the cavity layer 21 is a silicon oxide film and thus can stabilize its form, light transmittance, refractive index, and the like more than when made of a resin material. The coupling layers 11, 12 are silicon oxide films and thus can stabilize the transmission characteristic of the light advancing from the light-transmitting substrate 3 to the interference filter unit 20 and that of the light progressing from the interference filter unit 20 to the light-detecting substrate 4 more than when made of resin materials. The fact that the cavity layer 21 and coupling layers 11, 12 are silicon oxide films can also prevent their quality from being degraded by changes in temperature, high humidity, and the like of the environment where they are in use. Specifically, the cavity layer 21 and coupling layers 11, 12 can prevent moisture absorption which may occur if they are made of resin materials, while suppressing thermal expansion and contraction more, so as to become more thermally stable, than when made of resin materials. Therefore, the spectroscopic sensor 1 becomes extremely reliable.

The cavity layer 21 is a silicon oxide film formed by thermally oxidizing silicon. This stably yields the cavity layer 21 with high quality at low cost.

The coupling layers 11, 12 are silicon oxide films formed by a film forming process using TEOS as a material gas. This can form the coupling layers 11, 12 at low temperature and high speed with low stress, so as to prevent the cavity layer 21 and DBR layers 22, 23 from being damaged, whereby the cavity layer 21 and DBR layers 22, 23 are obtained with high quality.

The optical filter layer 5 is formed on the light-transmitting substrate 3 so as to oppose the DBR layer 22. This allows light in a predetermined wavelength to become efficiently incident on the interference filter unit 20.

Additionally, in the spectroscopic sensor 11, the filter region 24 is surrounded by the surrounding region 25 with the predetermined distance d therebetween in the cavity layer 21, while the end part 24e of the filter region 24 and the end part 25e of the surrounding region 25 are connected to each other by the connecting region 26. As a consequence, any external force acting in a direction perpendicular to the direction in which the light-transmitting substrate 3 and light-detecting substrate 4 oppose each other is buffered by the surrounding region 25 and connecting region 26, whereby the filter region 24 can be prevented from being damaged.

The front face 25a of the surrounding region 25 has substantially the same height as with the part 24h located closest to the light-transmitting substrate 3 in the front face 24a of the filter region 24 or is positioned nearer to the light-transmitting substrate 3 than is this part 24h. As a consequence, any external force acting in a direction parallel to the direction in which the light-transmitting substrate 3 and light-detecting substrate 4 oppose each other (e.g., an external force applied upon direct bonding between coupling layers 11a, 11b or 12a, 12b which will be explained later) can be received by the surrounding region 25, so as to be prevented from damaging the filter region 24.

The front face 26a of the connecting region 26 has substantially the same height as with the part 24l located closest to the light-detecting substrate 4 in the front face 24a of the filter region 24 or positioned nearer to the light-detecting substrate 4 than is this part 24l. As a consequence, any external force acting in a direction perpendicular to the direction in which the light-transmitting substrate 3 and light-detecting substrate 4 oppose each other can be prevented from being directly exerted on the front face 24a of the filter region 24, which is a surface for forming the DBR layer 22.

Figure 3:
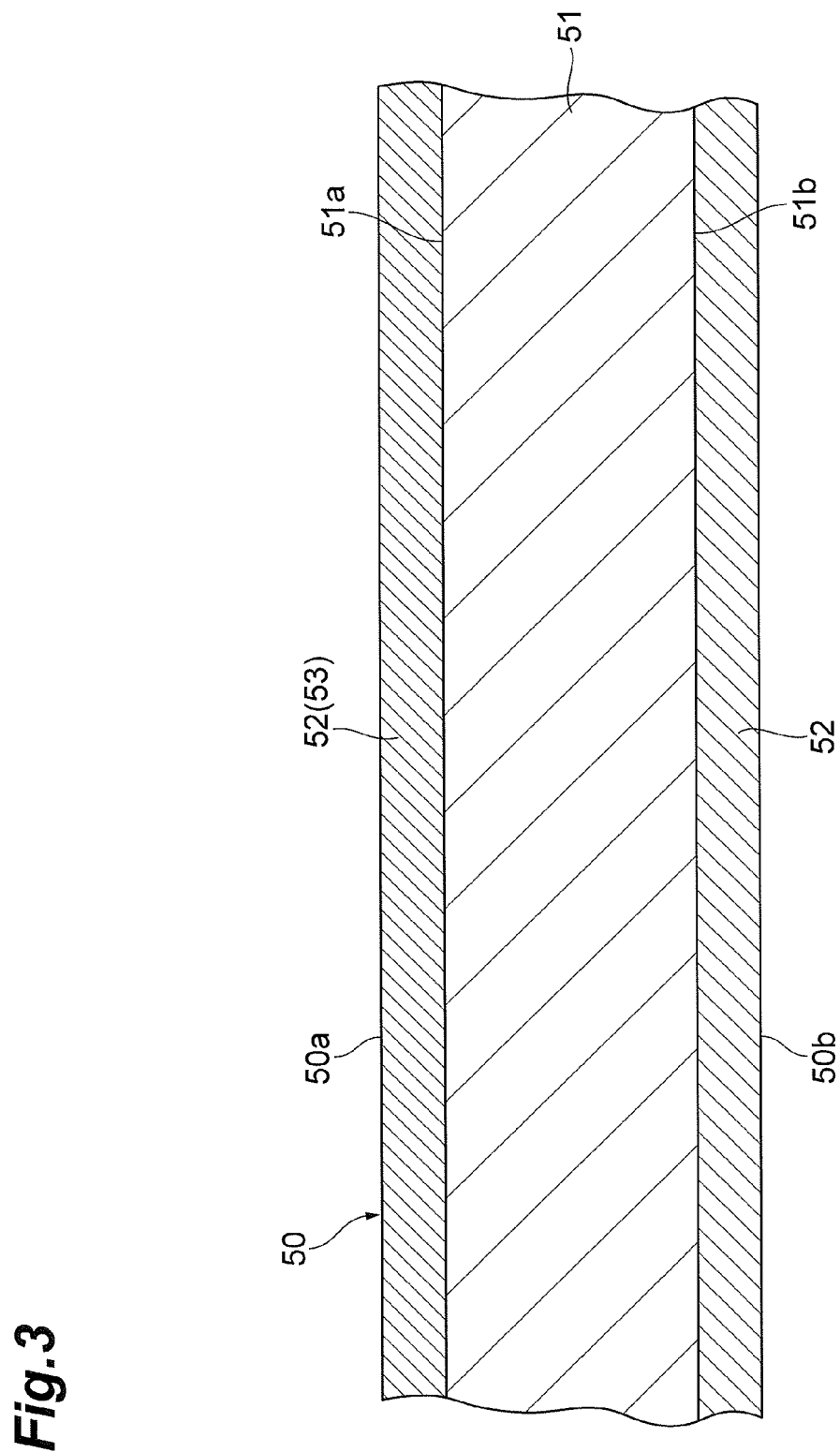
FIG. 3 is a vertical sectional view for explaining a method for manufacturing the spectroscopic sensor of FIG. 1.

A method for manufacturing the above-mentioned spectroscopic sensor 1 will now be explained. First, as FIG. 3 illustrates, one main face 50a of a silicon substrate 50 and the other main face 50b thereof are thermally oxidized, so as to form silicon oxide films 52 on one main face 51a of a handle substrate 51 made of silicon and the other main face 51b thereof, and the silicon oxide film 52 formed on the one main face 51a or other main face 51b of the handle substrate 51 is employed as a surface layer 53. Here, the silicon oxide film 52 formed on the one main face 51a of the handle substrate 51 is employed as the surface layer 53. The surface layer 53 has a thickness of about 1000 nm.

Figure 4:
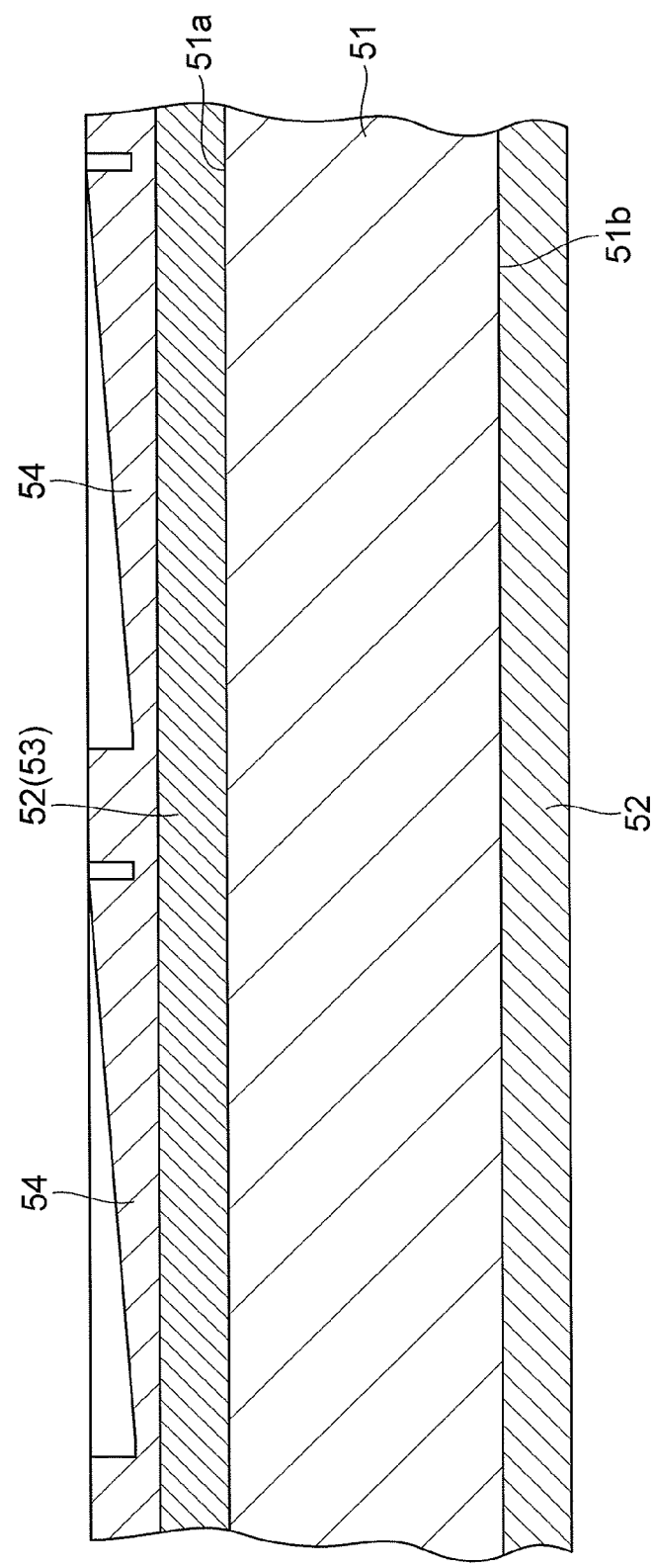
FIG. 4 is a vertical sectional view for explaining the method for manufacturing the spectroscopic sensor of FIG. 1.
Figure 5:
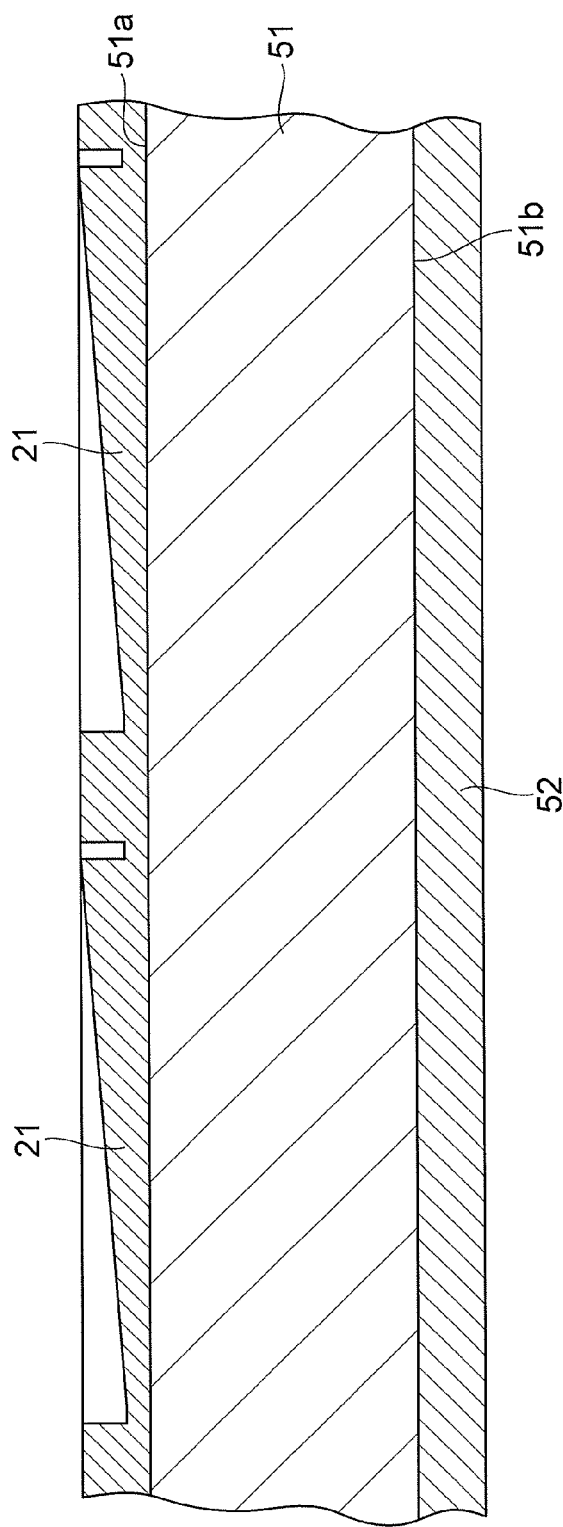
FIG. 5 is a vertical sectional view for explaining the method for manufacturing the spectroscopic sensor of FIG. 1.

Subsequently, as FIGS. 4 and 5 illustrate, a resist layer 54 for etching to produce a plurality of cavity layers 21 arranged in a matrix is formed on the surface layer 53. Then, using the resist layer 54 as a mask, the surface layer 53 provided on the handle substrate 51 is etched (etched back), so as to form a plurality of cavity layers 21 arranged in a matrix (first step).

Figure 6:
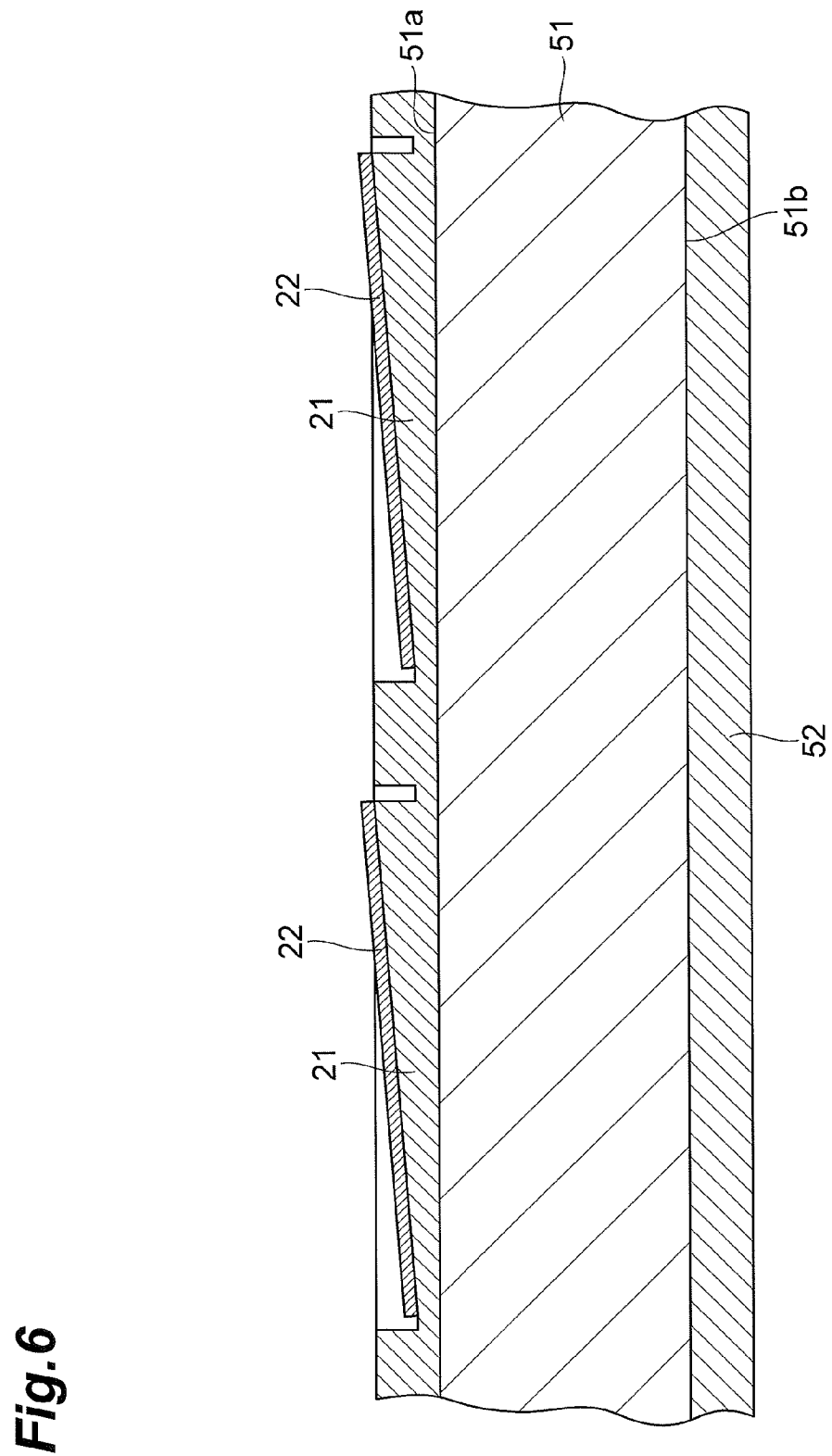
FIG. 6 is a vertical sectional view for explaining the method for manufacturing the spectroscopic sensor of FIG. 1.
Figure 7:
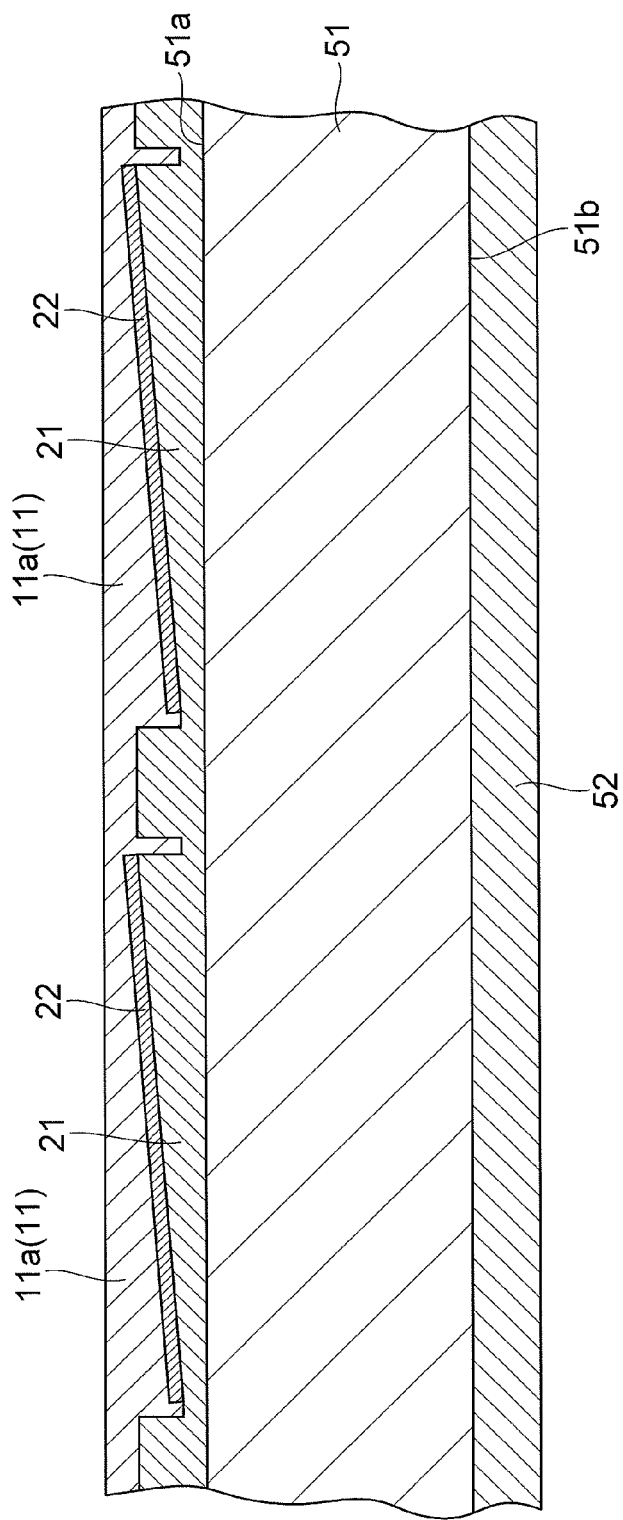
FIG. 7 is a vertical sectional view for explaining the method for manufacturing the spectroscopic sensor of FIG. 1.

Next, as FIG. 6 illustrates, the DBR layer 22 is formed on the cavity layer 21 for each part corresponding to one spectroscopic sensor 1 (second step). For forming the DBR layer 22, film forming by ion plating, vapor deposition, sputtering, or the like and patterning by photoetching and liftoff or etching are performed. Since one spectroscopic sensor 1 is provided with one cavity layer 21 here, when forming the DBR layer 22, the film forming may be performed on the whole surface so as to cover all the cavity layers 21 instead of patterning each part corresponding to one spectroscopic sensor 1. Subsequently, as FIG. 7 illustrates, a silicon oxide film is formed on the cavity film 21 such as to cover the DBR layer 22 by a film forming process using TEOS as a material gas, and its surface is flattened by CMP (Chemical Mechanical Polishing), thus forming the coupling layer 11a.

The film forming process using TEOS as a material gas enables film forming at low temperature (e.g., at a film forming temperature of 200° C. or lower) and high speed with low stress by plasma CVD, LP-CVD, AP-CVD, or the like. In the plasma CVD, TEOS is supplied by bubbling with an He gas, heating with a heater, or the like and caused to generate a plasma-assisted decomposition reaction within a chamber, so as to react with an $O_2$ gas, thereby forming the silicon oxide film.

Figure 8:
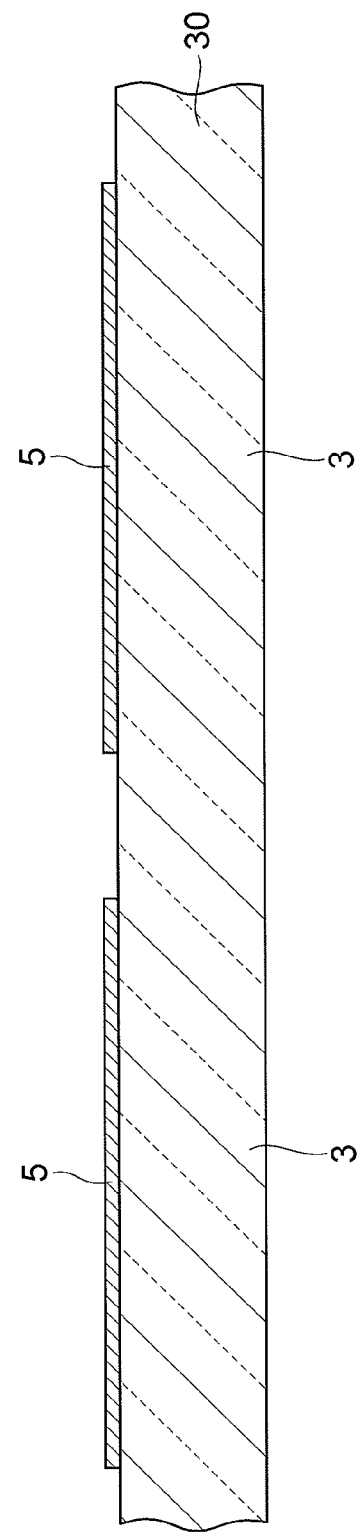
FIG. 8 is a vertical sectional view for explaining the method for manufacturing the spectroscopic sensor of FIG. 1.
Figure 9:
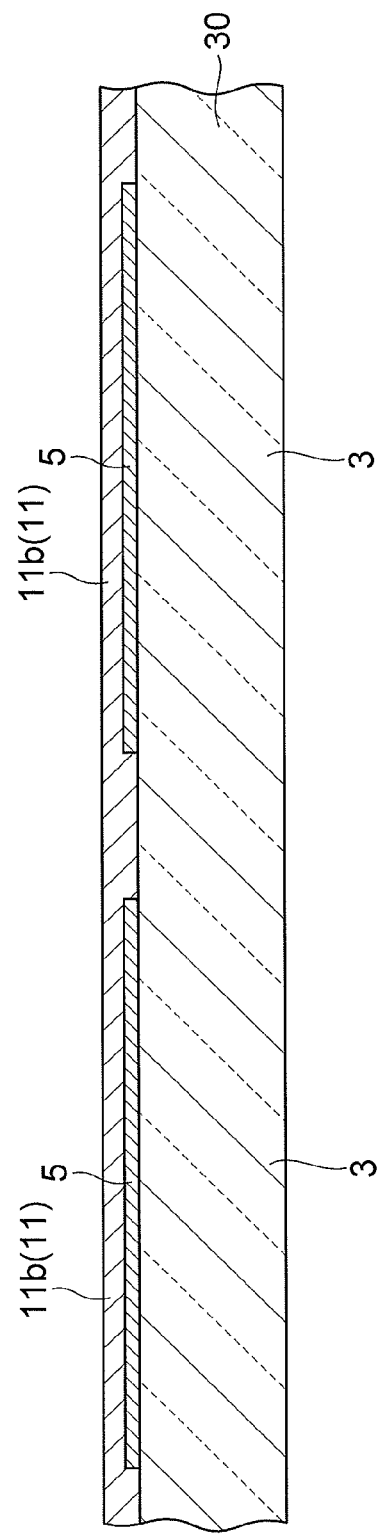
FIG. 9 is a vertical sectional view for explaining the method for manufacturing the spectroscopic sensor of FIG. 1.

On the other hand, as FIG. 8 illustrates, a light-transmitting wafer 30 including a plurality of light-transmitting substrates 3 arranged in a matrix is prepared, and the optical filter layer 5 is formed for each part corresponding to the light-transmitting substrate 3 on the light-transmitting wafer 30 (i.e., on the light-transmitting substrate 3). When forming the optical filter layer 5 from a dielectric multilayer film, film forming by ion plating, vapor deposition, sputtering, or the like and patterning by photoetching and liftoff or etching are performed. When forming from an organic color filter, the optical filter layer 5 is patterned by exposure and development or the like as with a photoresist. Since one spectroscopic sensor 1 is provided with one optical filter layer 5 here, when forming the optical filter layer 5, the film forming may be performed on the whole surface so as to cover all the light-transmitting wafer 30 instead of patterning each part corresponding to one spectroscopic sensor 1. Subsequently, as FIG. 9 illustrates, a silicon oxide film is formed on the light-transmitting wafer 30 such as to cover the optical filter layer 5 by a film forming process using TEOS as a material gas, and its surface is flattened by CMP, thus forming the coupling layer 11b.

Figure 10:
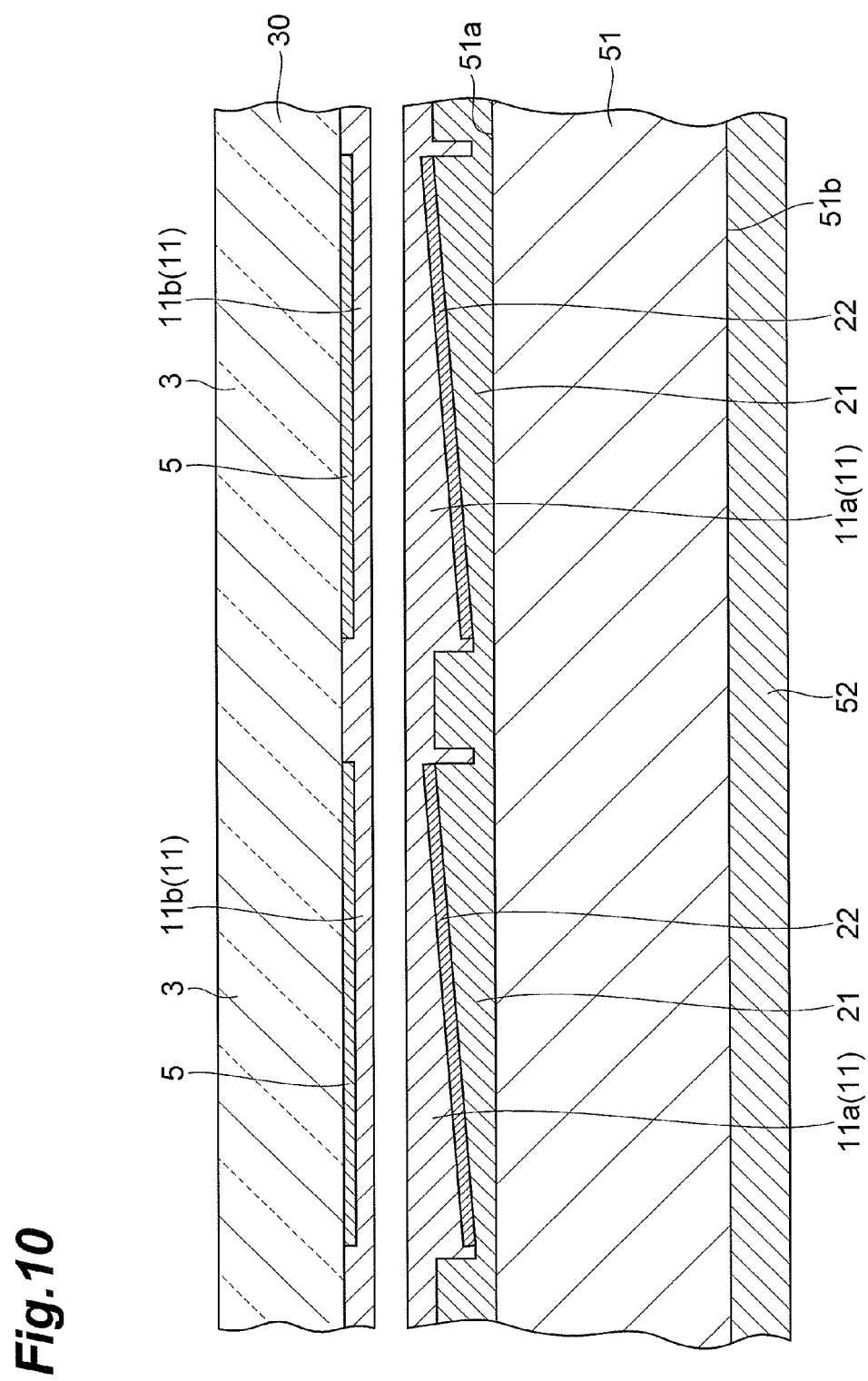
FIG. 10 is a vertical sectional view for explaining the method for manufacturing the spectroscopic sensor of FIG. 1.
Figure 11:
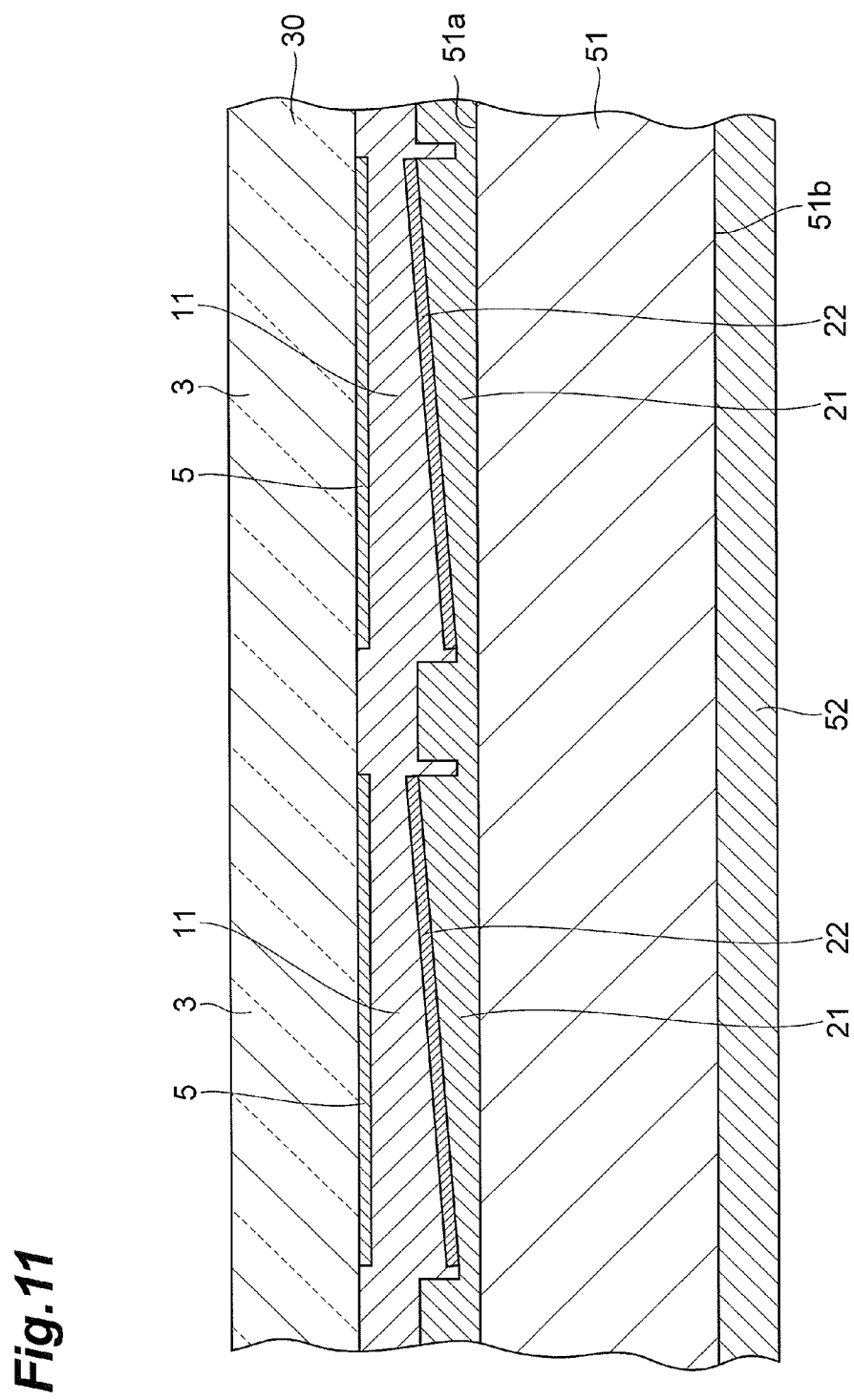
FIG. 11 is a vertical sectional view for explaining the method for manufacturing the spectroscopic sensor of FIG. 1.

Next, as FIGS. 10 and 11 illustrate, the DBR layer 22 and the optical filter layer 5 are caused to oppose each other for each part corresponding to one spectroscopic sensor 1, and the respective surfaces of the coupling layers 11a, 11b are directly bonded (e.g., by surface-activated bonding) to each other, thus joining the handle substrate 51 and the light-transmitting wafer 30 to each other (third step). That is, the light-transmitting substrate 3 is joined onto the DBR layer 22 such that the DBR layer 22 and the optical filter layer 5 oppose each other through the coupling layer 11. When the optical filter layer 5 is not formed on the light-transmitting wafer 30, the coupling layer 11b as a flattening layer is unnecessary.

Figure 12:
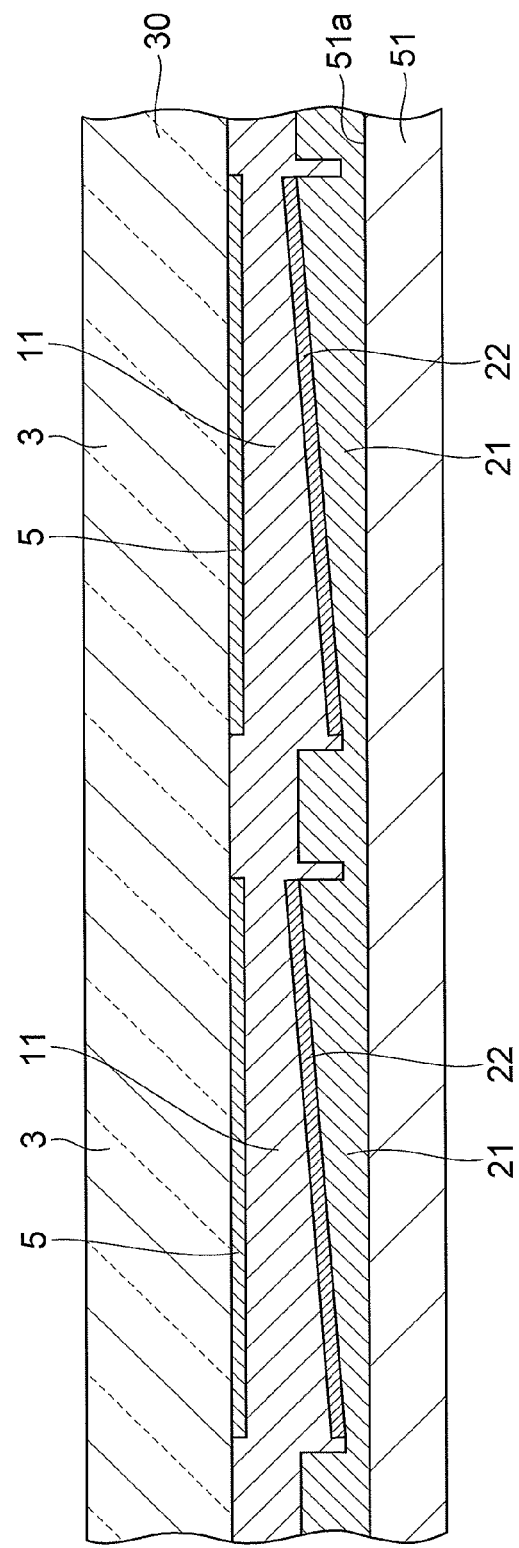
FIG. 12 is a vertical sectional view for explaining the method for manufacturing the spectroscopic sensor of FIG. 1.
Figure 13:
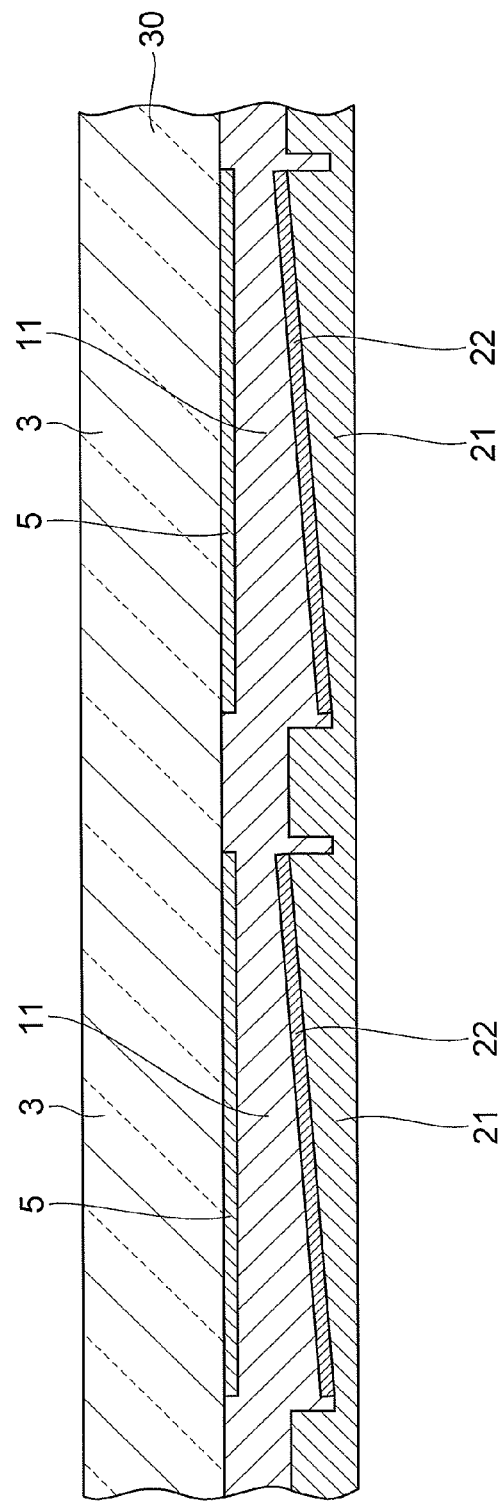
FIG. 13 is a vertical sectional view for explaining the method for manufacturing the spectroscopic sensor of FIG. 1.

Subsequently, as FIG. 12 illustrates, the silicon oxide film 52 formed on the other main face 51b of the handle substrate 51 and a part of the handle substrate 51 on the other main face 51b side are ground, so that the handle substrate 51 becomes thinner. Then, as FIG. 13 illustrates, the handle substrate 51 is wet- or dry-etched, so as to remove the handle substrate 51 from the cavity layer 21 (fourth step). Here, the silicon oxide film 52 formed on the other main face 51b of the handle substrate 51 and the handle substrate 51 may be removed by wet or dry etching without grinding.

Figure 14:
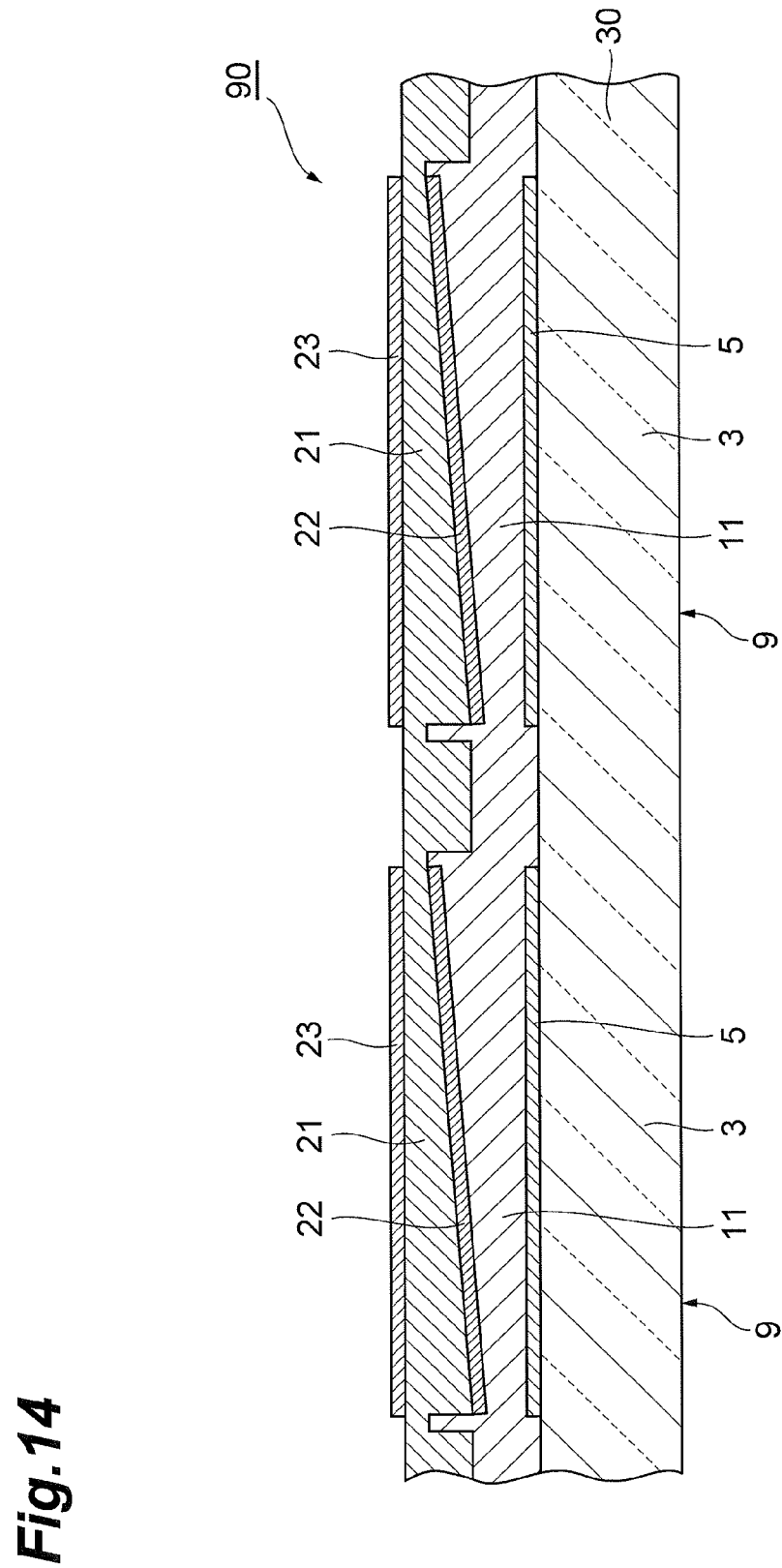
FIG. 14 is a vertical sectional view for explaining the method for manufacturing the spectroscopic sensor of FIG. 1.

Next, as FIG. 14 illustrates, the DBR layer 23 is formed in the same manner as with the DBR layer 22 on the cavity layer 21 exposed by removing the handle substrate 51 (fifth step). As a consequence, for each part corresponding to one spectroscopic sensor 1, the DBR layers 22, 23 oppose each other through the cavity layer 21, thereby forming the interference filter unit 20. Then, a part corresponding to one spectroscopic sensor 1 becomes a spectroscopic filter substrate 9, whereby a spectroscopic filter wafer 90 including a plurality of spectroscopic filter substrates 9 arranged in a matrix is produced. Since one spectroscopic sensor 1 is provided with one cavity layer 21 here, when forming the DBR layer 23, the film forming may be performed on the whole surface so as to cover all the cavity layers 21 instead of patterning each part corresponding to one spectroscopic sensor 1.

Figure 15:
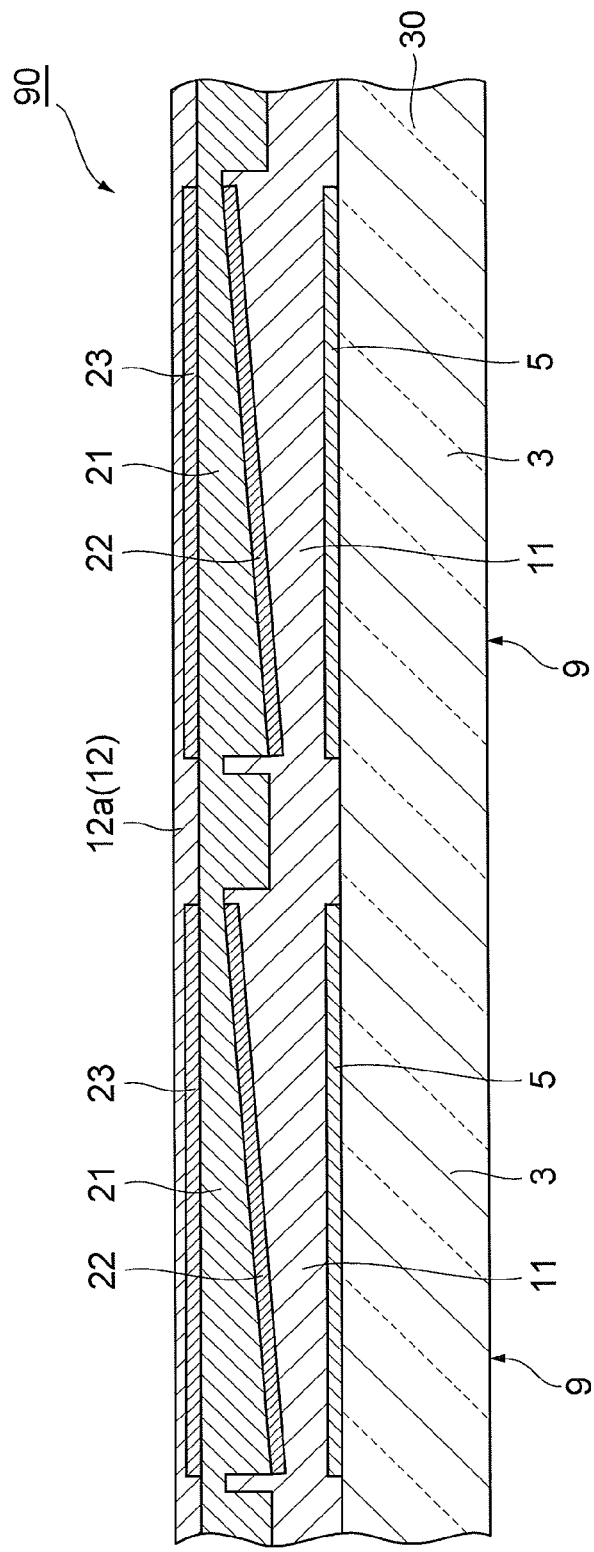
FIG. 15 is a vertical sectional view for explaining the method for manufacturing the spectroscopic sensor of FIG. 1.
Figure 16:
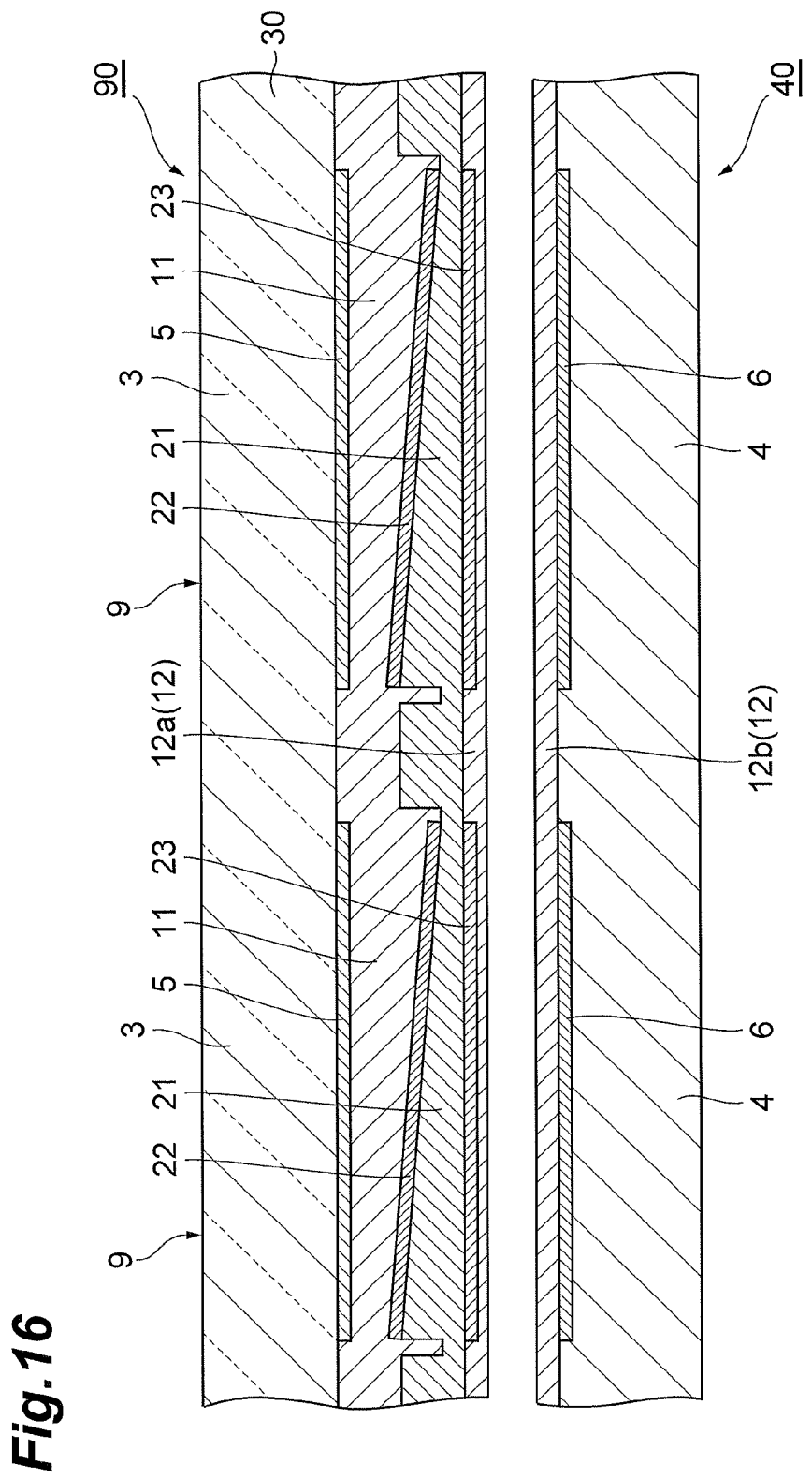
FIG. 16 is a vertical sectional view for explaining the method for manufacturing the spectroscopic sensor of FIG. 1.

Thereafter, as FIG. 15 illustrates, a silicon oxide film is formed on the cavity layer 21 such as to cover the DBR 23 by a film forming process using TEOS as a material gas, and its surface is flattened by CMP, thus forming the coupling layer 12a. On the other hand, as FIG. 16 illustrates, a light-detecting wafer 40 including a plurality of light-detecting substrates 4 is prepared. Then, a silicon oxide film is formed on the light-detecting wafer 40 such as to cover the light-receiving units 6 by a film forming process using TEOS as a material gas, and its surface is flattened by CMP, thus forming the coupling layer 12b.

Figure 17:
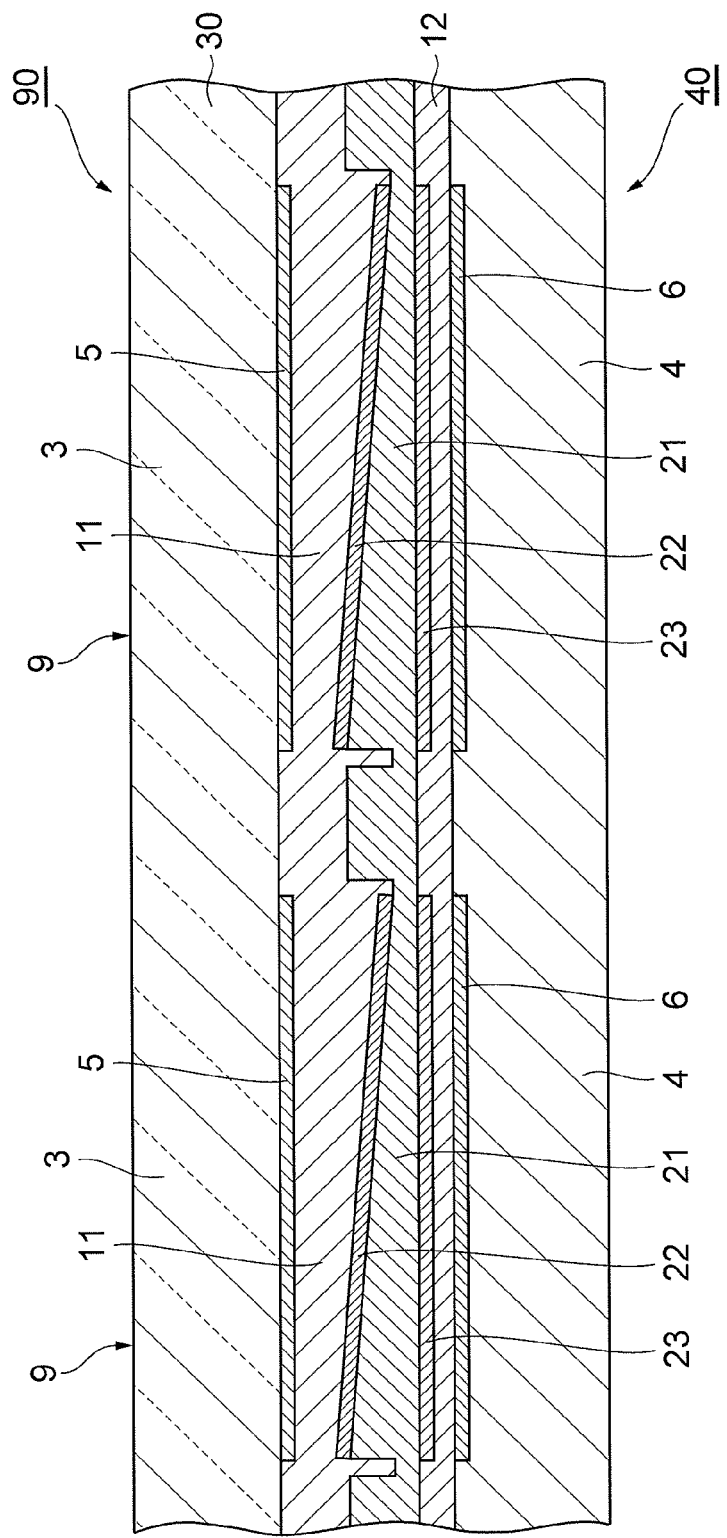
FIG. 17 is a vertical sectional view for explaining the method for manufacturing the spectroscopic sensor of FIG. 1.

Next, as FIGS. 16 and 17 illustrate, the DBR layer 23 and the light-receiving unit 6 are caused to oppose each other for each part corresponding to one spectroscopic sensor 1, and the respective surfaces of the coupling layers 12a, 12b are directly bonded to each other, thus joining the spectroscopic filter wafer 90 and the light-detecting wafer 40 to each other (sixth step). That is, the light-detecting substrate 4 is joined onto the DBR layer 23 such that the DBR layer 23 and the light-receiving unit 6 oppose each other through the coupling layer 12.

Figure 18:
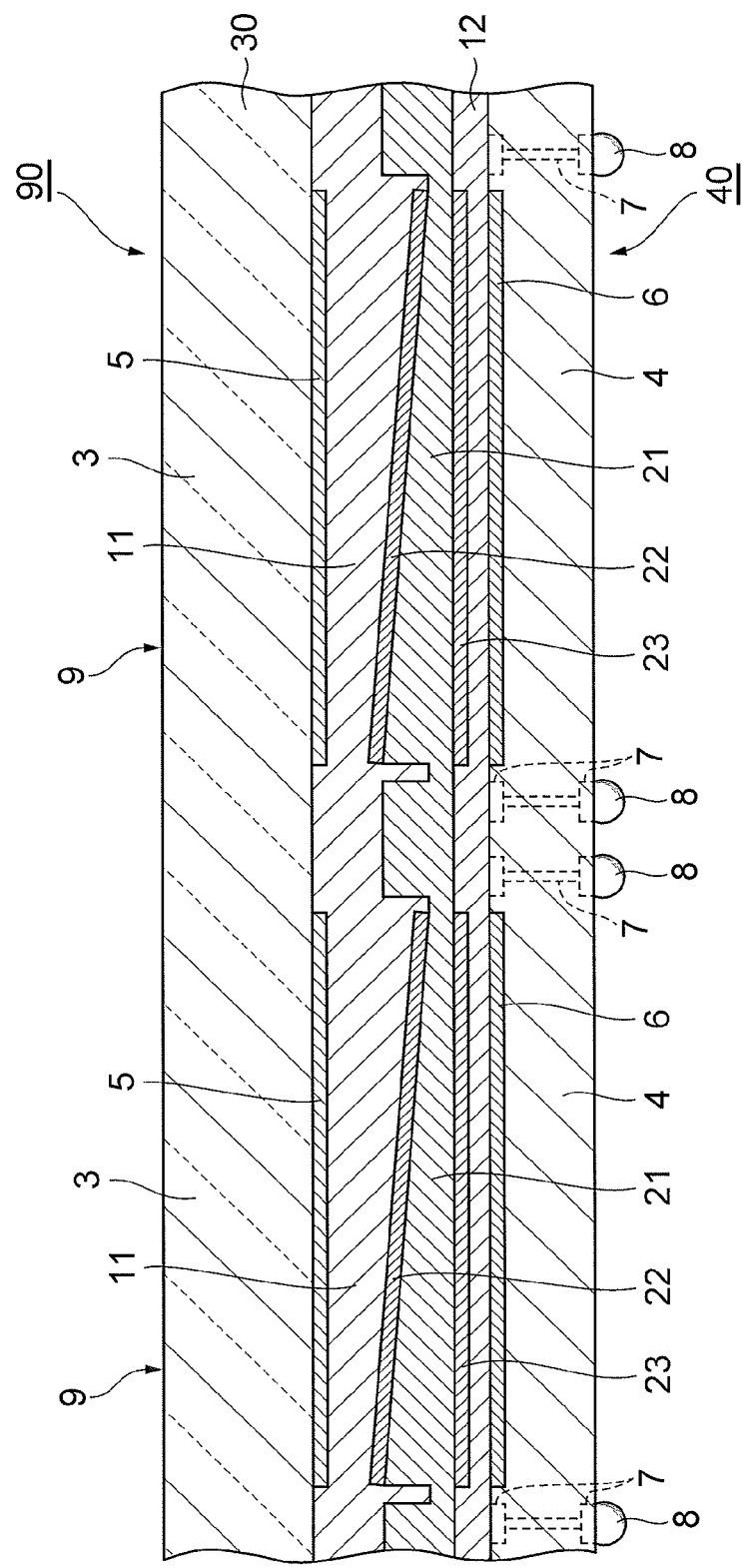
FIG. 18 is a vertical sectional view for explaining the method for manufacturing the spectroscopic sensor of FIG. 1.

Subsequently, as FIG. 18 illustrates, the rear face of the light-detecting wafer 40 is ground, polished, etched, and so forth, such that the light-detecting wafer 40 is thinned to a thickness on the order of 10 to 150 μm. Then, a through-hole is formed by etching in a part corresponding to front wiring, and through wiring, back wiring, and the like are formed, so as to produce the lead 7 for each part corresponding to one spectroscopic sensor 1. Further, the bump 8 is formed on the rear face of the light-detecting wafer 40 for each part corresponding to one spectroscopic sensor 1. Finally, the spectroscopic filter wafer 90 and light-detecting wafer 40 joined to each other are diced into each part corresponding to one spectroscopic sensor 1, so as to yield a plurality of spectroscopic sensors 1. Pad parts such as the front wiring and back wiring constituting the leads 7 may be not only embedded in the front and rear faces of the light-detecting wafer 40 (i.e., light-detecting substrate 4), but also disposed thereon so as to project therefrom by their thickness, for example.

As explained in the foregoing, the method for manufacturing the spectroscopic sensor 1 forms the cavity layer 21 by etching the surface layer 53 disposed on the handle substrate 51. Thus forming the cavity layer 21 by etching with the handle substrate 51 can stably yield the cavity layer 21 with a high precision. Further, after forming the cavity layer 21 and DBR layers 22, 23 on the light-transmitting substrate 3 side, the light-detecting substrate 4 is joined thereto. This can prevent the light-detecting substrate 4 from being damaged in the processes for forming the cavity layer 21 and DBR layers 22, 23. Hence, this method for manufacturing the spectroscopic sensor 1 can yield the highly reliable spectroscopic sensor 1.

Since the spectroscopic filter wafer 90 and the light-detecting wafer 40 are joined to each other after inspecting performances of each spectroscopic filter substrate 9 in the spectroscopic filter wafer 90, the light-detecting wafer 40 can be prevented from being wasted because of failures on the spectroscopic filter wafer 90 side.

Since the silicon oxide film 52 formed on one main face 51a of the handle substrate 51 made of silicon is employed as the surface layer 53, the cavity layer 21 can stably be obtained at low cost with high quality. Also, since both main faces 50a, 50b of the silicon substrate 50 are thermally oxidized so as to form the silicon oxide films 52 on both main faces of the handle substrate 51 made of silicon, the handle substrate 51 is restrained from warping. Hence, the cavity layer 21 can stably be obtained with a high precision.

The optical filter layer 5 is formed on the light-transmitting substrate 3, and then the light-transmitting substrate 3 is joined onto the DBR layer 22 such that the DBR layer 22 and the optical filter layer 5 oppose each other. This can make light in a predetermined wavelength range efficiently incident on the interference filter unit 20.

When etching the surface layer 53 disposed on the handle substrate 51 while using the resist layer 54 as a mask, a part corresponding to the groove G in the resist layer 54 is removed in advance, so that a part corresponding to the groove G in the surface layer 53 is exposed at first. When the part corresponding to the groove G in the surface layer 53 is exposed, oxygen breaks away from the surface layer 53 made of $SiO_2$, so as to work as an etchant for the resist layer 54. Here, the part corresponding to the groove G in the surface layer 53 surrounds the part corresponding to the filter region 24 in the surface layer 53. Therefore, the whole part corresponding to the filter region 24 in the surface layer 53 is stably fed with oxygen and, as a result, reliably etched.

Without such oxygen supply, the etchant density distribution is likely to be biased by a loading effect and the like (e.g., the etchant is supplied more and less in the peripheral and center parts of the handle substrate 51, respectively), so that the form of the filter region 24 produced by etching may vary depending on locations in the handle substrate 51. In particular, when the resist layer 54 is made of an organic material, the etching rate varies greatly depending on the state of supplying oxygen as the etchant, whereby the above-mentioned supply of oxygen is very important.

When dicing the spectroscopic filter wafer 90 and light-detecting wafer 40 joined to each other into each part corresponding to one spectroscopic sensor 1, chipping and the like can be prevented from occurring, since the spectroscopic filter wafer 90 and light-detecting wafer 40 are firmly integrated together as a whole by direct bonding between the coupling layers 11a, 11b and between the coupling layers 12a, 12b.

Figure 19:
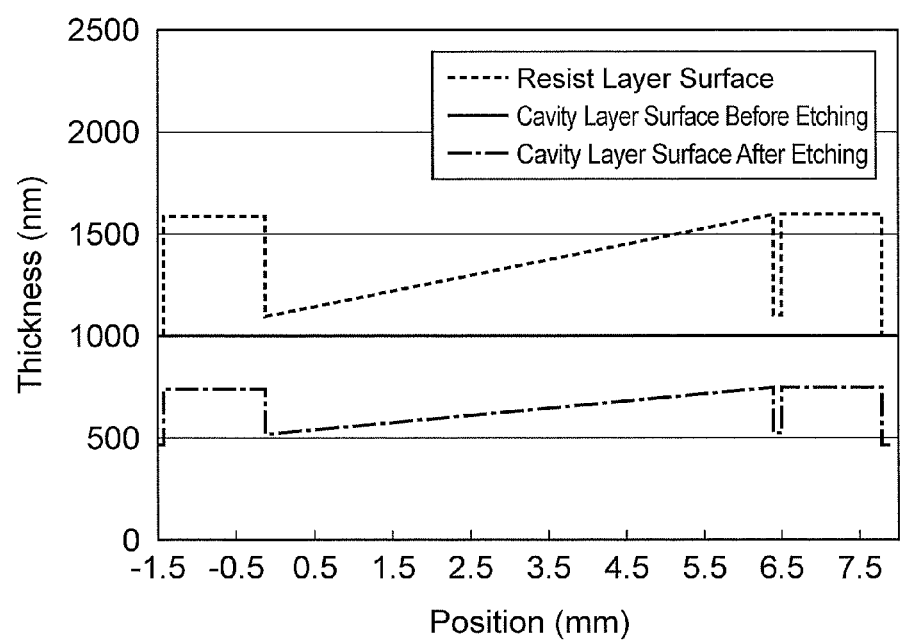
FIG. 19 is a profile chart illustrating the relationship between a resist layer and the cavity layer.

The relationship between the resist layer 54 and the cavity layer 21 will now be explained. As FIG. 19 illustrates, the resist layer 54 is formed on a flat surface (see a solid line in FIG. 19) of the cavity layer 21 before etching (i.e., the surface layer 53). The resist layer 54 has a three-dimensional form corresponding to the shape of the cavity layer 21 to be formed (i.e., the cavity layer 21 after etching). Such a resist layer 54 can be formed by utilizing a photomask whose transmittance is adjusted according to locations, photolithography or EB lithography whose amount of dose is adjusted according to locations, nanoimprinting, and the like.

When performing etch back (i.e., whole surface etching) based on the form of the resist layer 54, the etching rate for the resist layer 54 and cavity layer 21 may be adjusted depending on etching conditions. This can produce various forms of cavity layers 21 from the resist layer 54 having one kind of form. In the case illustrated in FIG. 19, the etching rate for the resist layer 54 is about twice as fast as that for the cavity layer 21, so that the inclination of the surface of the cavity layer 21 after etching (see a dash-single-dot line in FIG. 19) is milder than that of the surface of the resist layer 54 (see a broken line in FIG. 19).

Figure 20:
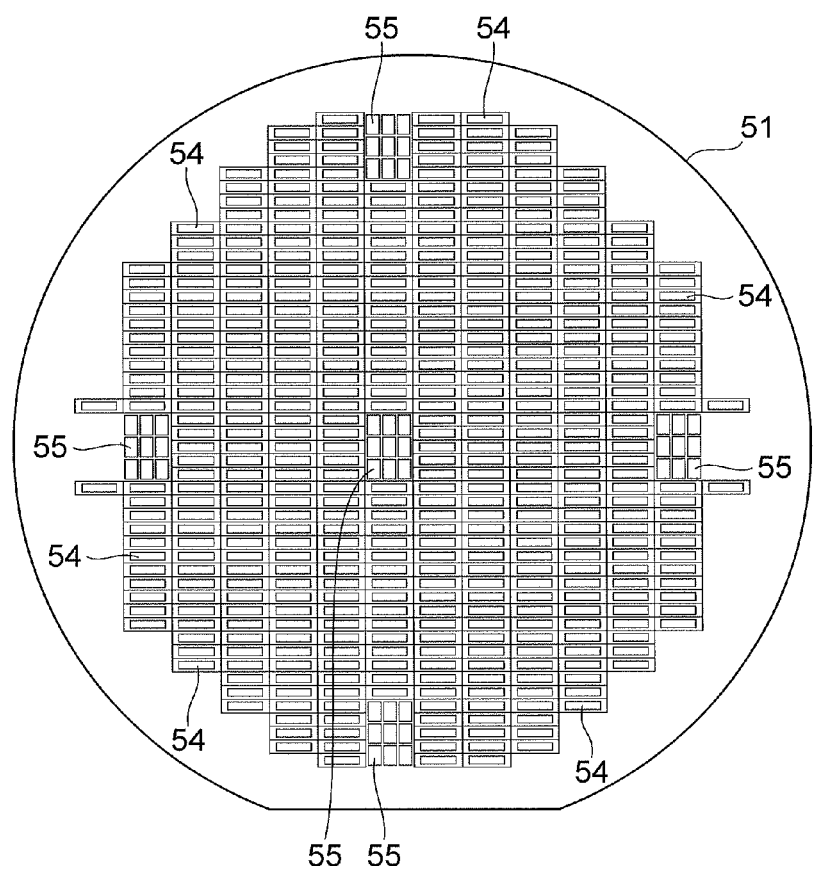
FIG. 20 is a plan view of a handle substrate formed with the resist layer.

A monitor pattern disposed on the handle substrate 51 will now be explained. While the surface layer 53 is formed by a substantially constant thickness on the handle substrate 51 as FIG. 4 illustrates, not only the resist layer 54 for forming a plurality of cavity layers 21 by etching, but resist layers 55 as a monitor pattern are also formed on the surface layer 53 as FIG. 20 illustrates. The resist layers 54, 55 are integrally formed by utilizing the photomask, photolithography or EB lithography, nanoimprinting, and the like as mentioned above.

The resist layers 55 as a monitor pattern are grouped by a plural number (9 here), and the resulting groups are arranged at a plurality of locations (4 peripheral locations and 1 center location here) on the handle substrate 51. Each of the grouped resist layers 55 is formed by a substantially constant thickness corresponding to its corresponding one of a plurality of parts of one resist layer 54. For example, the grouped resist layers 55 have the thickness of a predetermined part of the resist layer 54 corresponding to a predetermined part of the filter region 24, the thickness of a predetermined part of the resist layer 54 corresponding to a predetermined part of the surrounding region 25, and the thickness of a predetermined part of the resist layer 54 corresponding to a predetermined part of the connecting region 26 (i.e., the bottom face of the groove G).

As a consequence, measuring the thickness of the surface layer 53 in a part stripped of the resist layer 55 as a monitor pattern with an optical thickness meter at a predetermined timing such as that in the middle of etching the surface layer 53 or after the completion thereof can acquire the thickness of a predetermined part of the cavity layer 21 corresponding thereto. When the measurement timing is in the middle of etching the surface layer 53, at which the resist layer 54 remains in a predetermined part of the cavity layer 21, the thickness of the resist layer 54 remaining in this part can be acquired by the same method.

Thus utilizing the resist layer 55 as a monitor pattern is very effective, since each cavity layer 21 is small, while the surface 24a of the filter region 24 is tilted, so that the thickness of the cavity layer 21 is hard to measure directly with an optical thickness meter. Further, since the resist layers 55 as a monitor pattern are arranged at a plurality of locations on the handle substrate 51, how the etching progresses (progress distribution) in the whole surface layer 53 on the handle substrate 51 can be evaluated.

The thickness of the cavity layer 21 corresponding to a predetermined part of the filter region 24 can also be acquired in the following manner. That is, the difference in level between the surface of the cavity layer 21 corresponding to the predetermined part of the filter region 24 and the bottom face of the groove G is measured by an AFM (Atomic Force Microscope), a step gauge of a probe type, or the like at a predetermined timing such as that in the middle of etching the surface layer 53 or after the completion thereof. On the other hand, in a part stripped of the resist layer 55 as a monitor pattern corresponding to the bottom face of the groove the thickness of the surface layer 53 is measured by an optical thickness meter. Then, the difference in level between the surface of the cavity layer 21 and the bottom face of the groove G is added to the thickness of the surface layer 53 as measured, so as to compute the thickness of the cavity layer 21 corresponding to the predetermined part of the filter region 24. When the measurement timing is in the middle of etching the surface layer 53, at which the resist layer 54 remains in a part corresponding to the predetermined part of the cavity layer 21, the thickness of the resist layer 54 remaining in this part can be acquired by the same method.

While an embodiment of the present invention is explained in the foregoing, the present invention is not limited thereto. For example, various materials and forms may be employed for constituent members of the spectroscopic sensor without being limited to those mentioned above.

Figure 21:
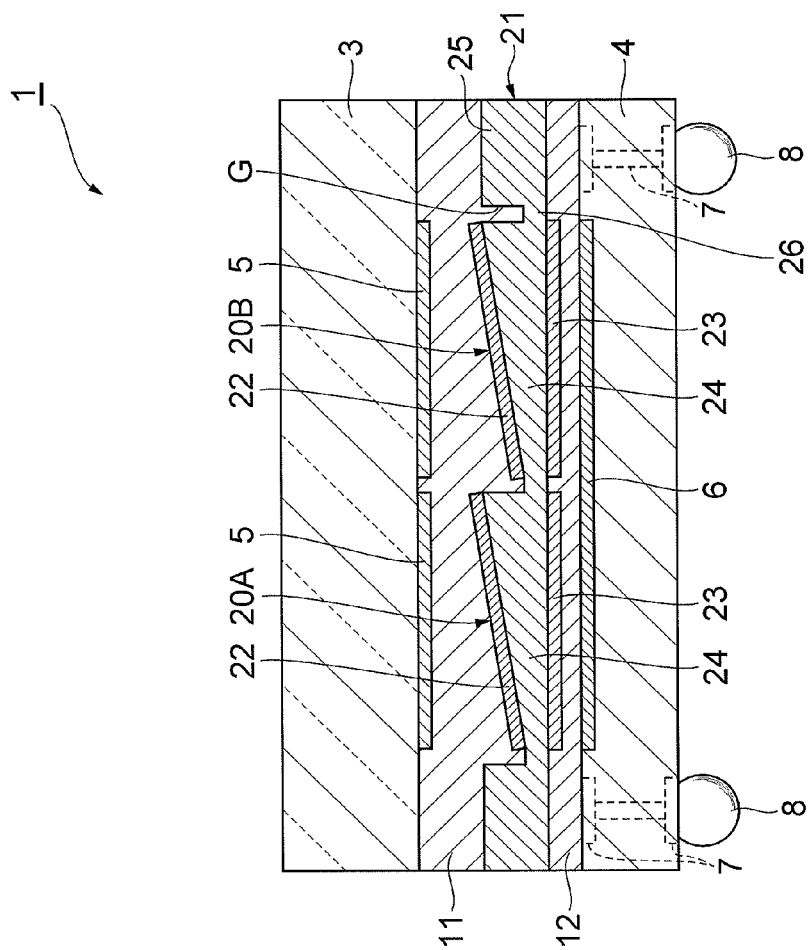
FIG. 21 is a vertical sectional view of a modified example of the spectroscopic sensor of FIG. 1.

The spectroscopic sensor may comprise a plurality of interference filter units for selectively transmitting therethrough light in a predetermined wavelength range according to an incident position thereof. A spectroscopic sensor comprising a plurality of interference filter units will now be explained. As FIG. 21 illustrates, this spectroscopic sensor 1 comprises a plurality of interference filter units 20A, 20B. The interference filter units 20A, 20B are arranged in a row longitudinally of the spectroscopic sensor 1 between the light-transmitting substrate 3 and the light-detecting substrate 4.

In the cavity layer 21, as FIGS. 21 and 22 illustrate, filter regions 24 formed for the interference filter units 20A, 20B, respectively, are juxtaposed to each other, while each filter region 24 is held between DBR layers 22, 23. A surrounding region 25 surrounds the juxtaposed filter regions 24, 24 with a predetermined distance d therefrom when seen in the incident direction of light. A connecting region 26 connects an end part on the light-detecting substrate 4 side of the juxtaposed filter regions 24, 24 and an end part on the light-detecting substrate 4 side of the surrounding region 25 to each other.

The respective DBR layers 22 for the interference filter units 20A, 20B differ from each other in their kinds, and their boundaries may overlap each other partly, be in contact with each other with no gap therebetween, or be separated from each other by a gap of about 5 µm, for example. The respective DBR layers 23 for the interference filter units 20A, 20B differ from each other in their kinds, and their boundaries may overlap each other partly, be in contact with each other with no gap therebetween, or be separated from each other by a gap of about 5 µm, for example. Examples of the two DBR layers different from each other in their kinds include films constituted by different materials and (single-layer or multilayer) films made of the same materials with different thicknesses. The respective optical filter layers 5 for the interference filter units 20A, 20B differ from each other in their kinds, and their boundaries may overlap each other partly, be in contact with each other with no gap therebetween, or be separated from each other by a gap of about 5 µm, for example.

In thus constructed spectroscopic sensor 1, when light incident on the light-transmitting substrate 3 from the front face 3a thereof passes through the light-transmitting substrate 3 and reaches the rear face 3b thereof, only light in a predetermined wavelength range to be incident on the interference filter units 20A, 20B is transmitted through the optical filter layer 5. When the light transmitted through the optical filter layer 5 is incident on any of the interference filter units 20A, 20B, light in a predetermined wavelength range selectively passes therethrough according to its incident position. That is, a wavelength of light to enter each channel of the light-receiving unit 6 of the light-detecting substrate 4 is uniquely determined by the thicknesses and kinds of the DBR layers 22, 23 and thickness of the cavity layer 21 at the incident position. As a consequence, light having a different wavelength is detected for each channel of the light-receiving unit 6 in the light-detecting substrate 4.

Colored glass or filter glass which transmits therethrough light in a predetermined wavelength range may also be used as a material for the light-transmitting substrate 3. Another optical filter layer may be formed on the front face 3a of the light-transmitting substrate 3 in addition to or in place of the optical filter layer 5. The light-detecting substrate 4 is not limited to the one-dimensional sensor, but may be a two-dimensional sensor. The thickness of the cavity layer 21 may vary two-dimensionally or stepwise. A single-layer reflective metal film of AL, Au, Ag, or the like may be used as a mirror layer in place of the DBR layers 22, 23. The spectroscopic sensor may also be constructed as an SMD (Surface Mount Device) instead of a CSP.

Any of optical resins such as epoxy, silicone, and acrylic, dielectrics such as $TiO_2$, $Ta_2O_5$, $Nb_2O_5$, $Al_2O_3$, and $MgF_2$, and semiconductors such as Si and Ge may also be used as a material for the cavity layer 21 (i.e., a material for the surface layer 53 to be etched).

The coupling layers 11, 12 may also be silicon oxide films formed by plasma CVD using a silane gas, coating type SOG (Spin On Glass), vapor deposition, sputtering, or the like. Joining through an optical resin layer or at an outer edge part of the spectroscopic sensor 1 may be employed in place of the joining through the coupling layers 11, 12 (i.e., direct bonding). The joining through the optical resin layer may use any of optical resins such as organic materials based on epoxy, acrylic, and silicone and hybrid materials made of organic and inorganic substances as a material for the optical resin layer. The joining at the outer edge part of the spectroscopic sensor 1 can be achieved by low-melting glass, solder, or the like while keeping a gap with a spacer. In this case, the region surrounded by the joint may be left as an air gap or filled with an optical resin.

A silicon oxide film may be formed on one main face of the handle substrate made of silicon by a film forming process using TEOS as a material gas, plasma CVD using a silane gas, coating type SOG, vapor deposition, sputtering, LP-CVD, or the like and employed as a surface layer. Silicon oxide films may be formed on both main faces of the handle substrate made of silicon by LP-CVD instead of thermal oxidization, and the silicon oxide film formed on one of the main faces of the handle substrate may be used as a surface layer. That is, the cavity layer that is a silicon oxide film is not limited to the one formed by thermally oxidizing silicon. However, forming the silicon oxide film by thermal oxidization has merits in that the cavity layer becomes a denser film, has better uniformity in thickness, incurs smaller amounts of impurities, and exhibits more stable optical characteristics such as transmittance and refractive index than when made by the other methods mentioned above.

INDUSTRIAL APPLICABILITY

The present invention can yield a highly reliable spectroscopic sensor.

REFERENCE SIGNS LIST

1 . . . spectroscopic sensor; 3 . . . light-transmitting substrate; 4 . . . light-detecting substrate; 5 . . . optical filter layer; 20, 20A, 20B . . . interference filter unit; 21 . . . cavity layer; 22 . . . DBR layer (first mirror layer); 23 . . . DBR layer (second mirror layer); 50 . . . silicon substrate; 50a . . . one main face; 50b . . . other main face; 51 . . . handle substrate; 51a . . . one main face; 51b . . . other main face; 52 . . . silicon oxide film; 53 . . . surface layer

The invention claimed is:

1. A method for manufacturing a spectroscopic sensor comprising an interference filter unit, having a cavity layer and first and second mirror layers opposing each other through the cavity layer, for selectively transmitting therethrough light in a predetermined wavelength range according to an incident position thereof; a light-transmitting substrate for transmitting therethrough light incident on the interference filter unit; and a light-detecting substrate for detecting the light transmitted through the interference filter unit; the method comprising:

a first step of forming the cavity layer by etching a surface layer disposed on a handle substrate;

a second step of forming the first mirror layer on the cavity layer after the first step;

a third step of joining the light-transmitting substrate onto the first mirror layer after the second step;

a fourth step of removing the handle substrate from the cavity layer after the third step;

a fifth step of forming the second mirror layer on the cavity layer devoid of the handle substrate after the fourth step; and a sixth step of joining the light-detecting substrate onto the second mirror layer after the fifth step.

2. A method for manufacturing a spectroscopic sensor according to claim 1, wherein, before the first step, a silicon oxide film is formed on one of main faces of the handle substrate made of silicon, and the silicon oxide film is employed as the surface layer.

3. A method for manufacturing a spectroscopic sensor according to claim 1, wherein, before the first step, both main faces of a silicon substrate are thermally oxidized so as to form silicon oxide films on both main faces of the handle substrate made of silicon, and the silicon oxide film formed on one of the main faces of the handle substrate is employed as the surface layer.

4. A method for manufacturing a spectroscopic sensor according to claim 1, wherein an optical filter layer for transmitting therethrough light in the predetermined wavelength range is formed on the light-transmitting substrate before the third step; and Wherein, in the third step, the light-transmitting substrate is joined onto the first mirror layer such that the first mirror layer and the optical filter layer oppose each other.

* * * * *